United States Patent
Dimitrov

(10) Patent No.: US 8,482,970 B2
(45) Date of Patent: *Jul. 9, 2013

(54) MULTI-BIT STRAM MEMORY CELLS

(75) Inventor: Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/248,592

(22) Filed: Sep. 29, 2011

(65) Prior Publication Data

US 2012/0020148 A1  Jan. 26, 2012

Related U.S. Application Data

(63) Continuation-in-part of application No. 12/869,950, filed on Aug. 27, 2010, now Pat. No. 8,198,660, which is a continuation of application No. 12/255,184, filed on Oct. 21, 2008, now Pat. No. 7,834,385.

(60) Provisional application No. 61/087,210, filed on Aug. 8, 2008.

(51) Int. Cl.
*G11C 11/16* (2006.01)

(52) U.S. Cl.
USPC .......... 365/158; 257/295; 257/E27.104

(58) Field of Classification Search
USPC .......... 257/295, 421, E27.104, E29.164, 257/E29.272, E21.208, E21.663, E21.664; 365/158
See application file for complete search history.

(56) References Cited

U.S. PATENT DOCUMENTS

| | | | |
|---|---|---|---|
| 6,683,815 B1 * | 1/2004 | Chen et al. | 365/225.5 |
| 7,095,071 B2 | 8/2006 | Fukuzumi | |
| 7,187,578 B2 | 3/2007 | Hong et al. | |
| 7,307,876 B2 | 12/2007 | Kent et al. | |
| 7,376,007 B2 | 5/2008 | Stephenson et al. | |
| 7,405,961 B2 | 7/2008 | Haratani | |
| 7,465,589 B2 | 12/2008 | Slaughter | |
| 7,486,552 B2 | 2/2009 | Apalkov | |
| 7,502,249 B1 | 3/2009 | Ding | |
| 7,834,385 B2 * | 11/2010 | Dimitrov et al. | 257/295 |
| 8,198,660 B2 * | 6/2012 | Dimitrov et al. | 257/295 |
| 2008/0180989 A1 | 7/2008 | Baek et al. | |
| 2008/0273380 A1 | 11/2008 | Diao | |
| 2009/0185410 A1 | 7/2009 | Huai | |
| 2009/0310213 A1 | 12/2009 | Hing | |
| 2010/0053822 A1 | 3/2010 | Xi | |

* cited by examiner

*Primary Examiner* — Zandra Smith
*Assistant Examiner* — Paul Patton
(74) *Attorney, Agent, or Firm* — Mueting Raasch & Gebhardt

(57) ABSTRACT

A multi-bit spin torque magnetic element that has a ferromagnetic pinned layer having a pinned magnetization orientation, a non-magnetic layer, and a ferromagnetic free layer having a magnetization orientation switchable among at least four directions, the at least four directions being defined by a physical shape of the free layer. The magnetic element has at least four distinct resistance states. Magnetic elements with at least eight magnetization directions are also provided.

21 Claims, 8 Drawing Sheets

MULTI-BIT STRAM MEMORY CELLS

RELATED APPLICATIONS

This application is a continuation in part of U.S. patent application Ser. No. 12/869,950, filed on Aug. 27, 2010, which is a continuation of U.S. patent application Ser. No. 12/255,184 field on Oct. 21, 2008, which claims priority to U.S. Provisional Patent Application No. 61/087,210, filed on Aug. 8, 2008. The entire disclosures of application Ser. Nos. 12/869,950; 12/255,184; and 61/087,210 are incorporated herein by reference.

BACKGROUND

Spin torque transfer technology, also referred to as spin electronics, which is based on changing magnetic state of the system by momentum transfer from conduction electrons, is a recent development. Spin torque RAM or ST RAM is a non-volatile random access memory application that utilizes spin torque technology. Digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer (PL), and a ferromagnetic free layer (FL), each having a magnetization orientation. A non-magnetic barrier layer is therebetween. The magnetization orientations of the free layer and the pinned layer define the resistance of the overall magnetic element. Usually the orientation of the PL is fixed by the strong exchange coupling of an antiferromagnetic layer which is immediate contact with the PL. The resistance is changed by changing the orientation of the FL. One particular type of such an element is what is referred to as a "spin tunneling junction," "magnetic tunnel junction cell", "spin torque memory cell", and the like. When the magnetization orientations of the free layer and pinned layer are parallel, the resistance of the element is low ($R_L$). When the magnetization orientations of the free layer and the pinned layer are antiparallel, the resistance of the element is high ($R_H$). The magnetization orientation is switched by passing a current perpendicularly through the layers. The current direction is different for writing "1" or "0". To write "1" ($R_H$) the current flows from the PL to FL, and reversed to flow from FL to PL to write "0" ($R_L$).

Many magnetic elements store only two states or data bits, i.e., "0" and "1". Some magnetic elements, often referred to as multi-bit elements, are configured to store multiple states or data bits, i.e., four bits "00", "01", "10" and "11". One configuration for a four bit multi-bit element has two magnetic tunnel junctions combined, so that the magnetic element has two free layers and two pinned layers. The two free layers have different resistances, so that four different resistances are available for the overall resistance of the element. Other designs of multi-bit elements can be used.

BRIEF SUMMARY

The present disclosure relates to multiple-bit or multi-bit magnetic elements. The magnetic elements have a free layer with a physical construction configured to allow for at least four magnetization orientations.

In one embodiment, this disclosure provides a multi-bit spin torque magnetic element that has a ferromagnetic pinned layer having a pinned magnetization orientation, a non-magnetic layer, and a ferromagnetic free layer having a magnetization orientation switchable among at least four directions, the four directions being defined by a physical shape of the free layer. The magnetic element has at least four distinct resistance states.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to multi-bit magnetic elements where the free layer has a shape configured to hold at least four magnetization orientations. In accordance with the invention of this disclosure, there are at least four different relative orientations between the free layer magnetization orientation and the pinned layer magnetization orientation, due to the physical shape of the free layer. In some embodiments, there are four different relative orientations, providing four different data states for a two-bit magnetic element. In some other embodiments, there are eight different relative orientations between the free layer magnetization orientation and the pinned layer magnetization orientation, providing eight different data states for a three-bit magnetic element. Other embodiments may provide sixteen different relative orientations for a four-bit magnetic element. Having a free layer with a physical construction configured to allow for at least four magnetization orientations allows for forming multi-bit magnetic elements without the need for two free layers in the magnetic element, thus allowing for smaller dimensions.

While the present disclosure is not so limited, an appreciation of various aspects of the disclosure will be gained through a discussion of the examples provided below.

Figure 1A:
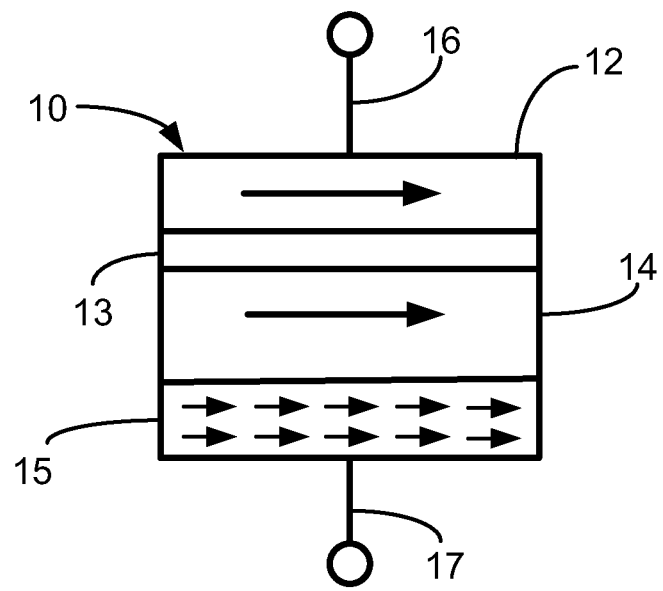
FIG. 1A is a cross-sectional schematic diagram of an illustrative magnetic element in a low resistance state.
Figure 1B:
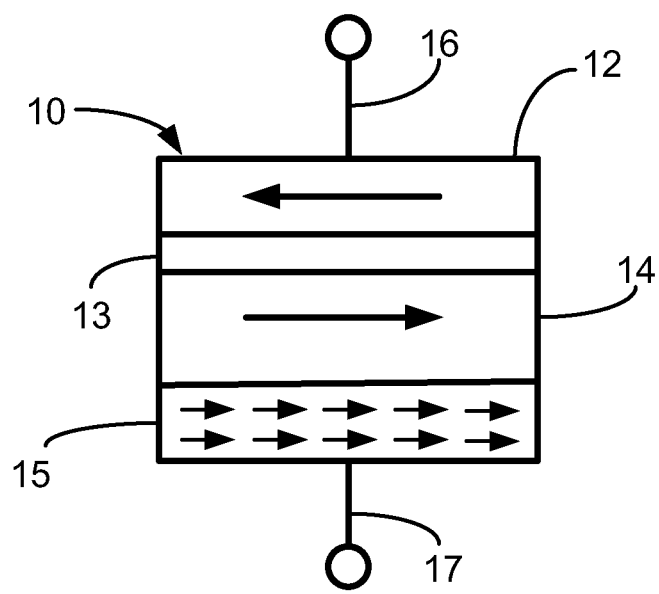
FIG. 1B is a cross-sectional schematic diagram of the magnetic element in a high resistance state.

FIGS. 1A and 1B are a cross-sectional schematic diagram of a generic magnetic element 10; in FIG. 1A, element 10 is in the low resistance state, with the magnetization orientations parallel and in FIG. 1B, element 10 is in the high resistance state, with the magnetization orientations anti-parallel. Magnetic element 10 may also be referred to as a variable resistive memory cell or variable resistance memory cell or the like.

Magnetic element 10 includes a ferromagnetic free layer 12 and a ferromagnetic reference (i.e., pinned) layer 14. Ferromagnetic free layer 12 and ferromagnetic pinned layer 14 are separated by a non-magnetic layer 13. Proximate ferromagnetic pinned layer 14 is an antiferromagnetic (AFM) pinning layer 15, which pins the magnetization orientation of ferromagnetic pinned layer 14 by exchange bias with the antiferromagnetically ordered material. Examples of suitable pinning materials include PtMn, IrMn, and others. Note that other layers, such as seed or capping layers, are not depicted for clarity.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and pinned layer 14 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Either or both layer 12, 14 are often about 0.1-10 nm thick, depending on the material and the desired resistance and switchability of free layer 12.

If magnetic element 10 is a magnetic tunnel junction cell, non-magnetic layer 13 is an insulating barrier layer sufficiently thin to allow tunneling of charge carriers between pinned layer 14 and free layer 12. Examples of suitable electrically insulating material include oxide materials (e.g., $Al_2O_3$, $TiO_x$ or MgO). If magnetic element 10 is a spin-valve cell, non-magnetic layer 13 is a conductive non-magnetic spacer layer. For either a magnetic tunnel junction cell or a spin-valve, non-magnetic layer 13 could optionally be patterned with free layer 12 or with pinned layer 14, depending on process feasibility and device reliability.

The following are various specific examples of magnetic tunnel junction cells. In some embodiments of magnetic element 10, layer 13 is oxide barrier $Ta_2O_5$ (for example, at a thickness of about 0.5 to 1 nanometer) and ferromagnetic free layer 12 and ferromagnetic pinned layer 14 include NiFe, CoFe, CoFeB or Co, or combinations of them. In other embodiments of magnetic tunnel junction cells, layer 13 is GaAs (for example, at a thickness of about 5 to 15 nanometers) and ferromagnetic free layer 12 and ferromagnetic pinned layer 14 include Fe, bcc-Co, or bcc-CoFe. In other embodiments of magnetic tunnel junction cells, layer 13 includes $Al_2O_3$ (for example, a few nanometers thick) and ferromagnetic free layer 12 and ferromagnetic pinned layer 14 include NiFe, CoFe, or Co. In yet other embodiments of magnetic tunnel junction cells, layer 13 includes MgO (for example, a few nanometers thick) and ferromagnetic free layer 12 and ferromagnetic pinned layer 14 include CoFeB, CoFe, or Co. The dimensions of magnetic element 10 are small, from about 50 to about a few hundred nanometers.

Returning to FIGS. 1A and 1B, a first electrode 16 is in electrical contact with ferromagnetic free layer 12 and a second electrode 17 is in electrical contact with ferromagnetic pinned layer 14 via pinning layer 15. Electrodes 16, 17 electrically connect ferromagnetic layers 12, 14 to a control circuit providing read and write currents through layers 12, 14. The resistance across magnetic element 10 is determined by the relative orientation of the magnetization vectors or magnetization orientations of ferromagnetic layers 12, 14. The magnetization direction of ferromagnetic pinned layer 14 is pinned in a predetermined direction by antiferromagnetic pinning layer 15 while the magnetization direction of ferromagnetic free layer 12 is free to rotate under the influence of spin torque. In accordance with the invention of this disclosure, the magnetization direction of free layer 12 is free to rotate to at least four different orientations.

FIG. 1A illustrates magnetic element 10 where the magnetization orientation of ferromagnetic free layer 12 is parallel and in the same direction of the magnetization orientation of ferromagnetic pinned layer 14. FIG. 1B illustrates magnetic element 10 where the magnetization orientation of ferromagnetic free layer 12 is anti-parallel and in the opposite direction of the magnetization orientation of ferromagnetic pinned layer 14. These are two of the possible magnetization orientations of free layer 12; additional possible magnetization orientations are illustrated and discussed herein in reference to later figures.

Switching the resistance state and hence the data state of magnetic element 10 via spin-transfer occurs when a current, under the influence of a magnetic layer of magnetic element 10, becomes spin polarized and imparts a spin torque on free layer 12 of magnetic element 10. When a sufficient level of polarized current and therefore spin torque is applied to free layer 12, the magnetization orientation of free layer 12 can be changed among different directions and accordingly, magnetic element 10 can be switched between the parallel state (i.e., as in FIG. 1A), the anti-parallel state (i.e., as in FIG. 1B), and other states.

The illustrative spin-transfer torque magnetic element 10 is used to construct a memory device where a data bit is stored in the spin torque memory cell by changing the relative magnetization state of free layer 12 with respect to pinned layer 14. The stored data bit can be read out by measuring the resistance of element 10 which changes with the magnetization direction of free layer 12 relative to pinned layer 14. In accordance with the invention of this disclosure, there are at least four different relative orientations between free layer 12 and pinned layer 14; in some embodiments, there are four different relative orientations, and in some other embodiments, there are eight different relative orientations.

In order for the spin-transfer torque magnetic element 10 to have the characteristics of a non-volatile random access memory, free layer 12 exhibits thermal stability against random fluctuations so that the orientation of free layer 12 is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes an easy and hard axis to form in thin magnetic layers. The hard and easy axes are defined by the magnitude of the external energy, usually in the form of a magnetic field, needed to fully rotate (saturate) the direction of the magnetization in that direction, with the hard axis requiring a higher saturation magnetic field.

Figure 2:
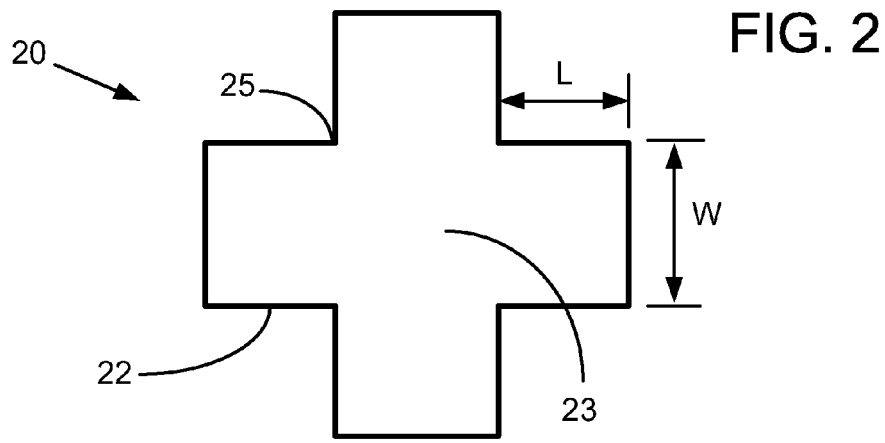
FIG. 2 is a schematic top view of a ferromagnetic free layer of a magnetic element, the free layer having four possible magnetization orientations.

FIG. 2 illustrates a ferromagnetic free layer having a physical shape configured to provide four magnetization orientations. Free layer 20, in the illustrated embodiment, is cross-shaped with four arms 22 extending from a center section 23. Each arm 22 has a width W and a length L. Each arm 22 has a constant width W along its length L; in other embodiments, the arms may taper or have some other shape. For free layer 20, each arm 22 is the same, having the same width W and length L. In some embodiments, including illustrated free layer 20, for each arm 22, its width W is the same as its length L. In other embodiments, width W is greater than length L, and in other embodiments, width W is less than length L. Examples of suitable lengths L include about 1-100 nm; examples of suitable widths W include about 1-100 nm. In some embodiments, either or both length L and width W are about 2-20 nm. In one exemplary embodiment, length L and width W are about ten times (10x) the thickness of free layer 20.

Arms 22 meet at interior corners 25. As described above in reference to magnetic element 10, free layer 20 is a ferromagnetic material such as, for example, Fe, Co or Ni and alloys thereof, such as NiFe and CoFe, and ternary alloys, such as CoFeB. Arms 22 and interior corners 25 may be formed, for example, by removing portions of a previously deposited ferromagnetic material layer, for example, by ion milling or wet milling. In alternate embodiments, arms 22 and interior corners 25 may be formed, for example, by depositing ferromagnetic material using a mask.

Figure 2A:
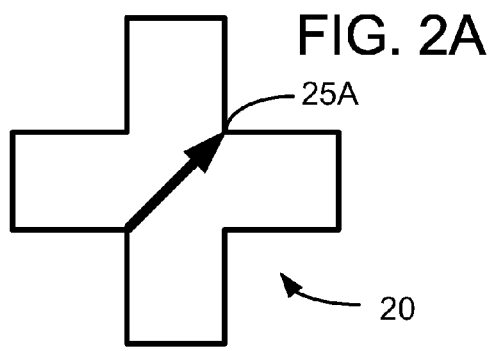
FIGS. 2A through 2D show the four possible magnetization orientations for the free layer of FIG. 2.
Figure 2B:
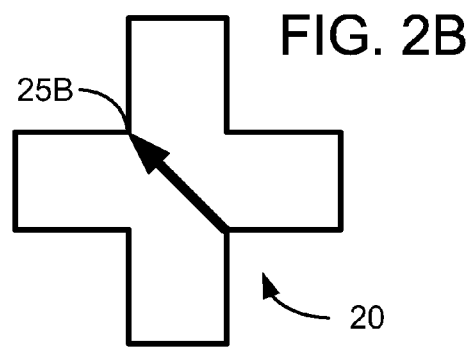
Figure 2C:
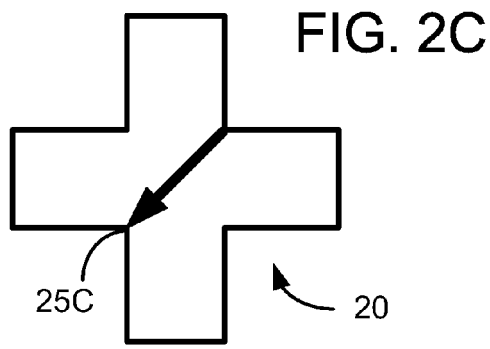
Figure 2D:
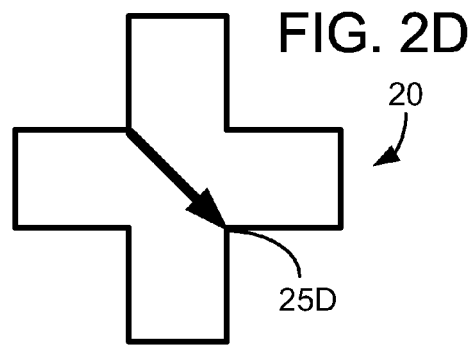

Free layer 20 has four stable magnetization orientations, illustrated in FIGS. 2A through 2D. In this embodiment of a shaped free layer, the four average magnetization orientations are toward the four interior corners 25, between adjacent arms and orthogonal to each other. In FIG. 2A, the magnetization orientation is toward a first corner 25A; in FIG. 2B, the magnetization orientation is toward a second corner 25B that is 90 degrees from first corner 25A; in FIG. 2C, the magnetization orientation is toward a third corner 25C, which is 180 degrees from first corner 25A and 90 degrees from second corner 25B; and in FIG. 2D, the magnetization orientation is toward a fourth corner 25D, which is 270 degrees (or −90 degrees) from first corner 25A, 180 degrees from second corner 25B, and 90 degrees from third corner 25C. Adjacent orientations are 90 degrees apart. Opposite orientations (e.g., 25A, 25C and 25B, 25D) are the easy axes of free layer 20.

For embodiments where the overall lateral dimension (e.g. length) of free layer 20 is less than about 100 nm, a strong exchange coupling interaction within free layer 20 maintains a state close to a single domain state for free layer 20. (An overall lateral dimension of 100 nm can be obtained with each arm 22 of free layer 20 having a length L and a width W of about 33.3 nm.) Free layer 20 can be engineered to have low magneto crystalline anisotropy and to have isotropic sheet film properties. These properties, in a four-fold symmetry geometry, create four stable magnetization orientations, as illustrated in FIGS. 2A through 2D. These four stable magnetization orientations can be utilized to create four different resistance states for two-bit per cell non-volatile memory.

Figure 3:
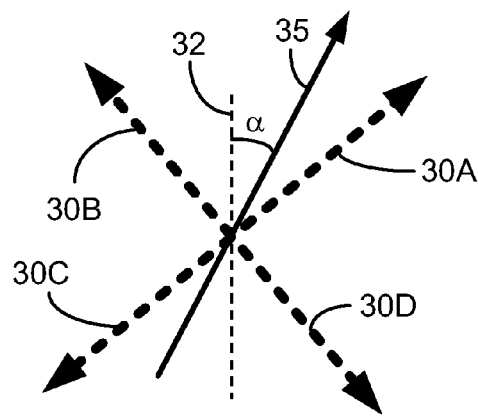
FIG. 3 is graphical diagram of the magnetization orientation of a ferromagnetic pinned layer in relation to four magnetization orientations of a ferromagnetic free layer.

The four magnetization orientations are in relation to the magnetization orientation of the corresponding pinned layer. FIG. 3 illustrates graphically the four magnetization orientations 30A, 30B, 30C, 30D of free layer 20. A reference line 32 is provided, which corresponds to one of arms 22 of free layer 20. The magnetization orientation of the corresponding pinned layer is labeled 35 and is present at an angle α from reference line 32. In order to have four distinct resistance states, the magnetization orientation of the pinning layer is neither aligned with reference line 32 (nor any of arms 22) nor the magnetization orientations 30A, 30B, 30C, 30D (i.e., not aligned with interior corners 25A, 25B, 25C, 25D of free layer 20). The magnetization orientation of the pinning layer can be at an angle α of about 10-35 degrees from reference line 32. In one embodiment, the magnetization orientation angle α is 22.3 degrees from reference line 32; in another embodiment, the magnetization orientation is equally between reference 32 and magnetization orientation 30A, having an angle α of 22.5 degrees from reference line 32.

Switching between the four distinct orientations, and thus four distinct, resistance states, can be achieved via spin torque effects. FIGS. 4A through 4D illustrate the four resistance states, due to a pinned layer magnetization orientation 45 with the four possible free layer magnetization orientations 40A, 40B, 40C, 40D. Reference line 42 is provided. In FIGS. 4A through 4D, the actual free layer magnetization orientation is identified as 48.

Figure 4A:
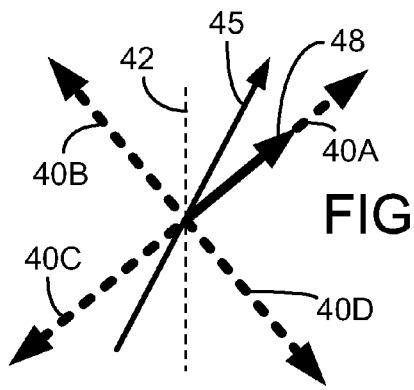
FIGS. 4A through 4D show the four possible magnetization orientations of the free layer in relation to the pinned layer.
Figure 4B:
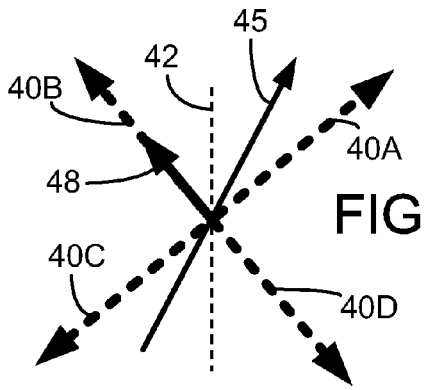
Figure 4C:
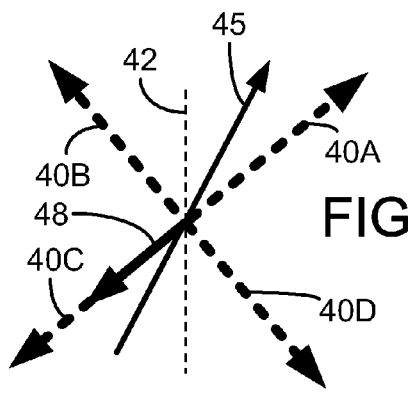
Figure 4D:
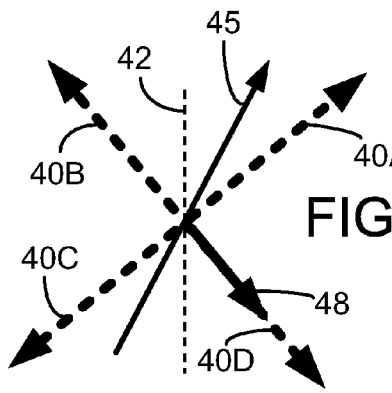

FIG. 4A illustrates a first state, State 1, with magnetization orientation 48 oriented to direction 40A, that can be achieved by driving a large current (for example, from about 100 microAmps to several hundred microAmps) from the pinned layer to the free layer in the magnetic element, no matter in which direction the magnetization orientation is originally oriented. State 2, in FIG. 4B, is obtained by passing a current from the free layer of State 1 (FIG. 4A) to the pinned layer. The current is selected to be sufficient to switch magnetization orientation 48 to direction 40B but not too large to switch magnetization orientation 48 to direction 40C. To switch to State 3 in FIG. 4C from State 2, a current is passed from the free layer to the pinned layer. To switch to State 4 in FIG. 4D from State 3, current is passed from the pinned layer to the free layer. The current is selected to be sufficient to switch magnetization orientation 48 to direction 40D but not too large to switch magnetization orientation 48 to direction 40A (State 1).

Figure 5:
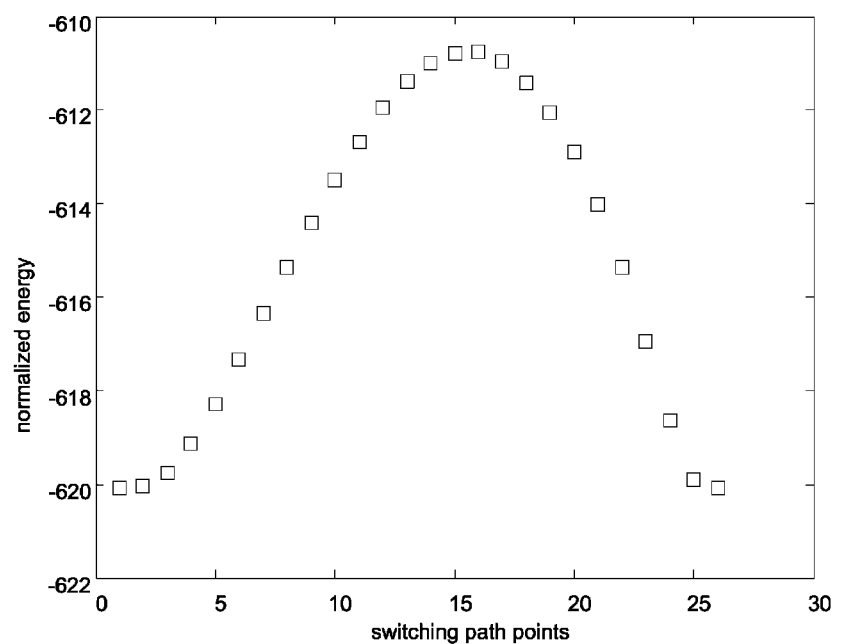
FIG. 5 is a graphical representation of the normalized energy barrier for switching the free layer between two neighboring magnetic states

FIG. 5 graphically illustrates an exemplary normalized energy barrier for switching the magnetization orientation 90 degrees between two adjacent states, for example, from direction 40B to direction 40A. FIG. 5 provides the normalized magnetic energy at various points between direction 40B and direction 40A to switch the magnetization orientation from direction 40B to direction 40A.

Figure 6A:
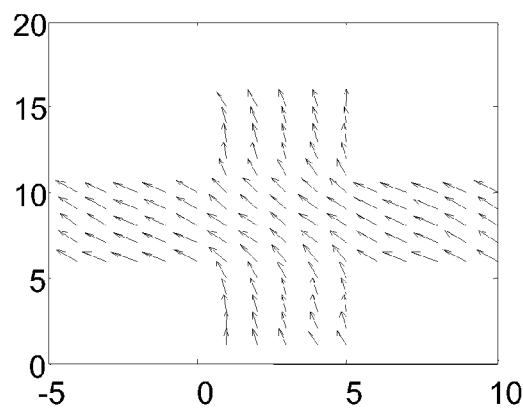
FIGS. 6A through 6D are graphical representations of results from micromagnetic modeling of four magnetization orientations of a free layer for switching between two neighboring states.
Figure 6B:
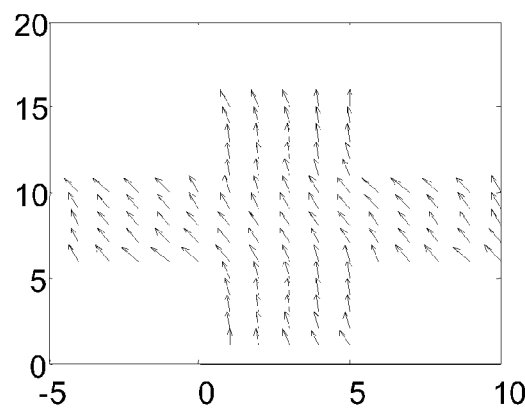
Figure 6C:
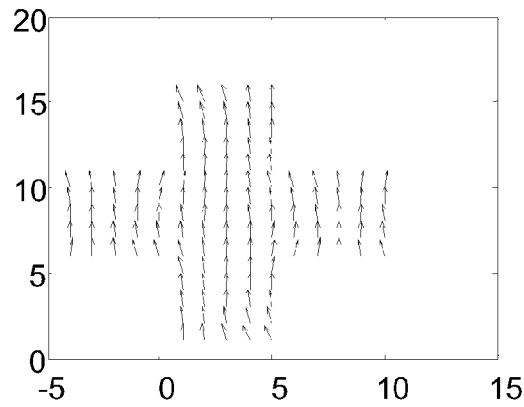
Figure 6D:
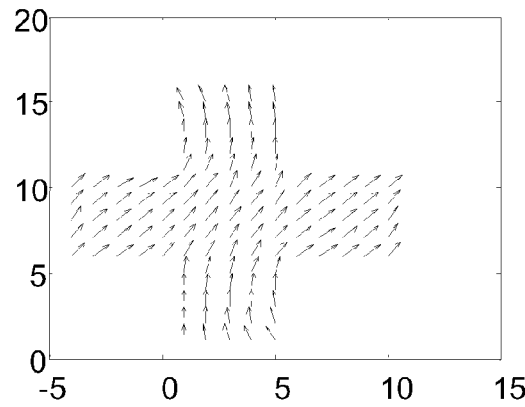
Figure 7A:
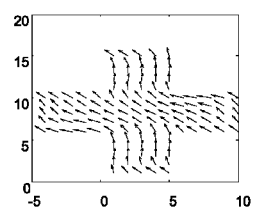
FIGS. 7A through 7D are additional graphical representations of results from computer modeling of four magnetization orientations of a free layer.
Figure 7B:
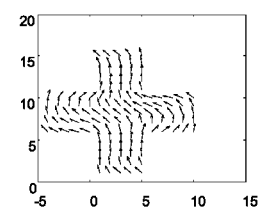
Figure 7C:
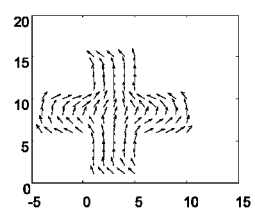
Figure 7D:
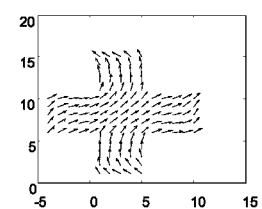

FIGS. 6A through 6D and FIGS. 7A through 7D graphically illustrate four magnetization orientations, taken at four different points, for an exemplary ferromagnetic free layer as its magnetization orientation is switched from direction 40B to direction 40A (of FIGS. 4A through 4D). In particular, FIGS. 6A and 7A show the magnetization orientation at point 0 of FIG. 5 (i.e., the magnetization orientation is toward direction 40B), FIGS. 6B and 7B show the magnetization orientation at point 10 of FIG. 5, FIGS. 6C and 7C show the magnetization orientation at point 15 of FIG. 5, and FIGS. 6D and 7D show the magnetization orientation at point 23 of FIG. 5 (i.e., the magnetization orientation is now toward direction 40A).

In order to obtain a thermally stabile magnetic tunnel junction, a normalized energy barrier ($\Delta E/k_B T$) of at least about 45 is desired. It has been found that a free layer having a cross shape, e.g., such as free layer 20 of FIG. 2, with a layer thickness of about 2-3 nm, a cross dimension of about 100 nm and less, and a magnetization $M_s$ of about 1200 emu/cc, provide a generally inferior design than a cross shaped free layer with a thickness of 3 nm or greater, a cross dimension of about 100 nm or greater, and magnetization $M_s$ of about 1400 emu/cc. This was determined based on computer modeling of free layers using various parameters.

The graphs of FIGS. 6A through 6D were modeled using a free layer such as free layer 20 of FIG. 2, using two different sets of parameters. The first set of parameters set a free layer magnetization of $M_s$=1200 emu/cc, a cross-shape having length L of 25 nm and width W of 25 nm (providing an overall dimension of 75 nm), a layer thickness of 2.5 nm, and exchange coupling length $l_{ex}$ 8.8 nm. The resulting energy barrier was $$\frac{\Delta E}{k_B T} = 20$$

The second set of parameters set a free layer magnetization of $M_s$=1400 emu/cc, a cross-shape having length L of 30 nm and width W of 30 nm (providing an overall dimension of 108 nm), a layer thickness of 3 nm, and exchange coupling length $l_{ex}$=10.4 nm. The resulting energy barrier was $$\frac{\Delta E}{k_B T} = 48$$

The second set of parameters provided a better configuration than the first set of parameters.

The graphs of FIGS. 7A through 7D were modeled using a free layer such as free layer 20 of FIG. 2, using two different sets of parameters; the parameters for FIGS. 7A through 7D utilized a weaker exchange. The first set of parameters set a free layer magnetization of $M_s$=1200 emu/cc, a cross-shape having length L of 25 nm and width W of 25 nm (providing an overall dimension of 75 nm), a layer thickness of 2.5 nm, and exchange coupling length $l_{ex}$ 5.0 nm. The resulting energy barrier was $$\frac{\Delta E}{k_B T} = 23$$

The second set of parameters set a free layer magnetization of $M_s$=1400 emu/cc, a cross-shape having length L of 30 nm and width W of 30 nm (providing an overall dimension of 108 nm), a layer thickness of 3 nm, exchange coupling length $l_{ex}$ 6.0 nm. The resulting energy barrier was $$\frac{\Delta E}{k_B T} = 53$$

The second set of parameters provided a better configuration than the first set of parameters.

Returning to FIG. 2 and FIGS. 2A through 2D, free layer 20 having four evenly spaced arms 22 has four unevenly or unequally spaced resistance states, due to the nonlinear dependence of the GMR effect on the on the angle between the free layer magnetization orientation and the pinned layer magnetization orientation. Having unequally or unevenly spaced resistance states may be a potential source for reduced reliability and possibly errors. An alternate to the symmetric shape of free layer 20 is to have an asymmetric or uneven free layer shape designed to provide equidistant resistance levels.

Figure 8:
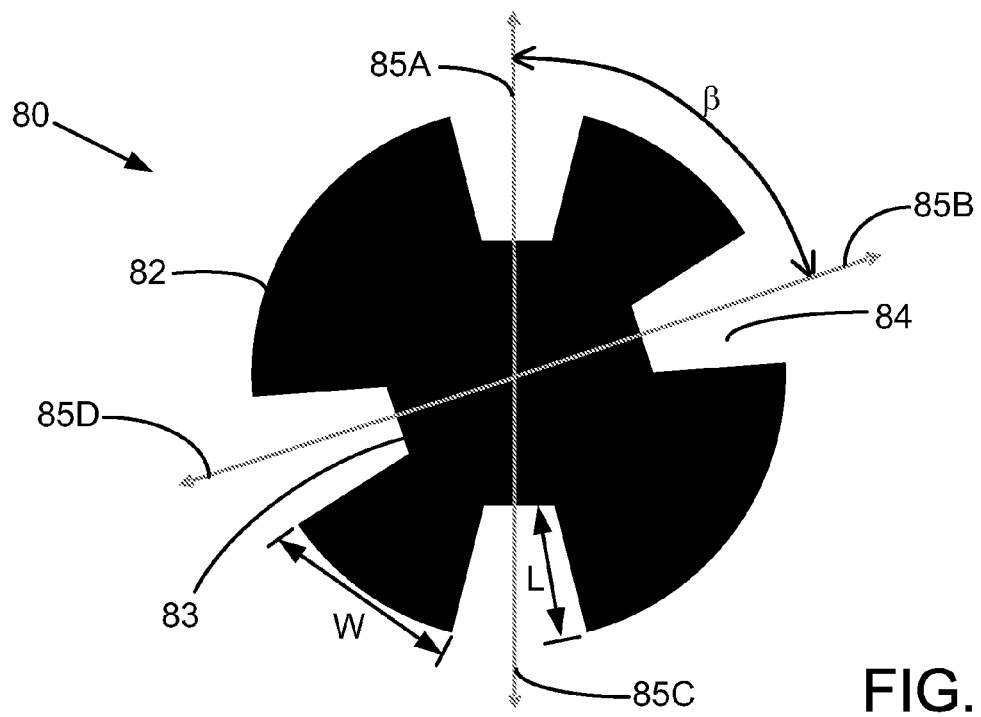
FIG. 8 is a schematic top view of a ferromagnetic free layer of a magnetic element, the free layer having four possible magnetization orientations.

FIG. 8 illustrates an embodiment of a ferromagnetic free layer for multi-bit magnetic elements, the free layer having an asymmetric shape with four equidistant resistance levels. That is, the free layer is physically not symmetrical among the four arms but the change in resistance between the possible magnetization orientations is the same. The various features of this free layer are similar to those of free layer 20 of FIG. 2 unless otherwise indicated. Free layer 80, in the illustrated embodiment, has four arms 82 extending from a center section 83. Each arm 82 has a width W and a length L. For free layer 80, adjacent arms 82 do not have the same width W and length L, but rather, adjacent arms 82 are different in width W. In some embodiments, oppositely positioned arms 82 or alternating arms 82 may have the same width W and/or length L. Additionally, each arm 82 increases in width W along its length L from center section 83. Examples of suitable lengths L include about 1-100 nm, e.g., about 5-30 nm; examples of suitable widths W include about 1-100 nm, e.g., about 5-50 nm. Between adjacent arms 82 is a void 84.

Free layer 80 has four stabilize magnetization orientations, illustrated as orientations 85A, 85B, 85C, 85D, which provide four distinct resistance states. In this embodiment of a shaped free layer, the four magnetization orientations are present in void 84 between adjacent arms 82. In most embodiments, the magnetization orientations are equidistant between two adjacent arms 82. In this asymmetric embodiment, magnetization orientations 85A, 85B, 85C, 85D are not orthogonal to each other, but rather have an angle either less than or greater than 90 degrees therebetween. Opposite magnetization orientations (e.g., 85A, 85C and 85B, 85D) are 180 degrees apart; opposite magnetization orientations are the easy axes of free layer 80. In FIG. 8, magnetization orientations 85A, 85B have an angle β therebetween. In one exemplary embodiment, angle β is about 80.5 degrees; thus, orientations 85A, 85B and 85C, 85D are 70.5 degrees apart and orientation 85B, 85C and 85D, 85A are 109.5 degrees apart. Having angle β approximately 80 degrees provides four distinct and equidistantly spaced resistances. With properly shaped asymmetric free layer, four-fold symmetry can be obtained where the two easy axes are not perpendicular but a specifically chosen angle.

Figure 9:
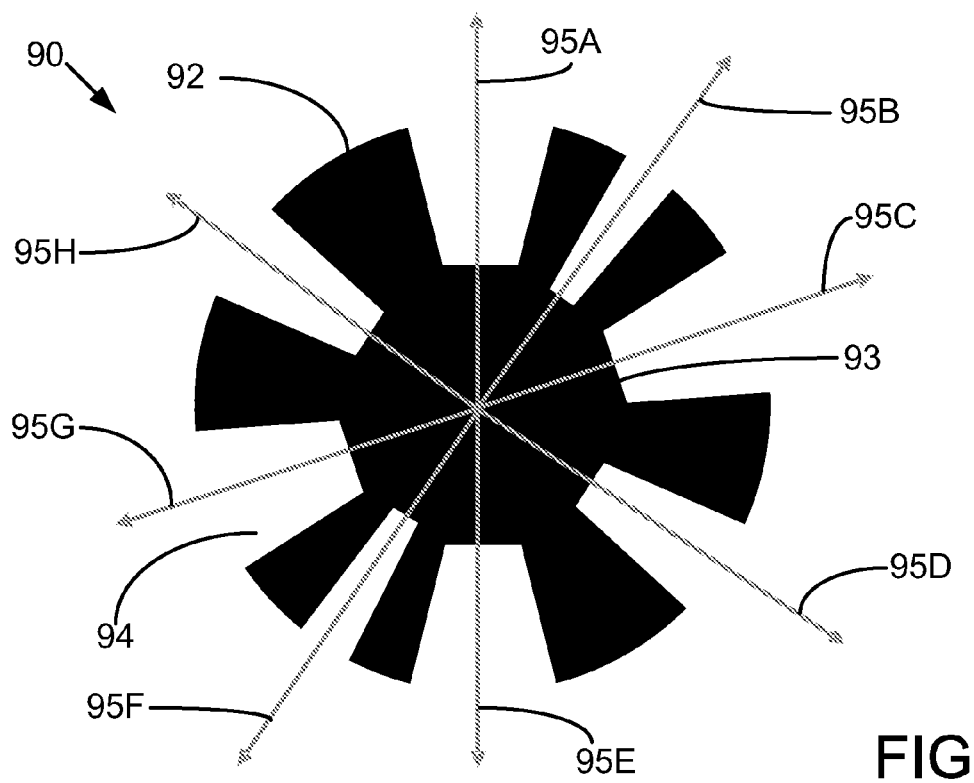
FIG. 9 is a schematic top view of a ferromagnetic free layer of a magnetic element, the free layer having eight possible magnetization orientations.

The multi-resistance (i.e., at least four) principal can be expanded to three bits per cell by further modifying the free layer of the magnetic cell and creating an eight-fold in plane symmetry with eight degenerate resistance states. FIG. 9 illustrates another embodiment of a ferromagnetic free layer for multi-bit magnetic elements, the free layer having an asymmetric shape with eight equidistant resistance levels. Free layer 90, in the illustrated embodiment, has eight arms 92 extending from a center section 93. Between adjacent arms 92 is a void 94. The various features of free layer 90 are similar to those of free layer 80 of FIG. 8 unless otherwise indicated.

Free layer 90 has eight stable magnetization orientations, illustrated as orientations 95A, 95B, 95C, 95D, 95E, 95F, 95G, 95H which provide eight distinct resistance states. The eight magnetization orientations are present in void 94 between adjacent arms 92. In this embodiment, magnetization orientations 95A, 95B, 95C, 95D, 95E, 95F, 95G, 95H have an angle either less than or greater than 45 degrees therebetween. Opposite magnetization orientations (e.g., 95A, 95C and 95B, 95D, etc.) are 180 degrees apart; opposite magnetization orientations are the easy axes of free layer 90. With a properly shaped asymmetric free layer, eight-fold symmetry can be obtained where the four easy axes are not at 45 degrees but at a specifically chosen angle. It is noted that for such a configuration for free layer 90 to be practical, extremely tight process control on shape, resistance and critical current distributions would have to be achieved.

Figure 10:
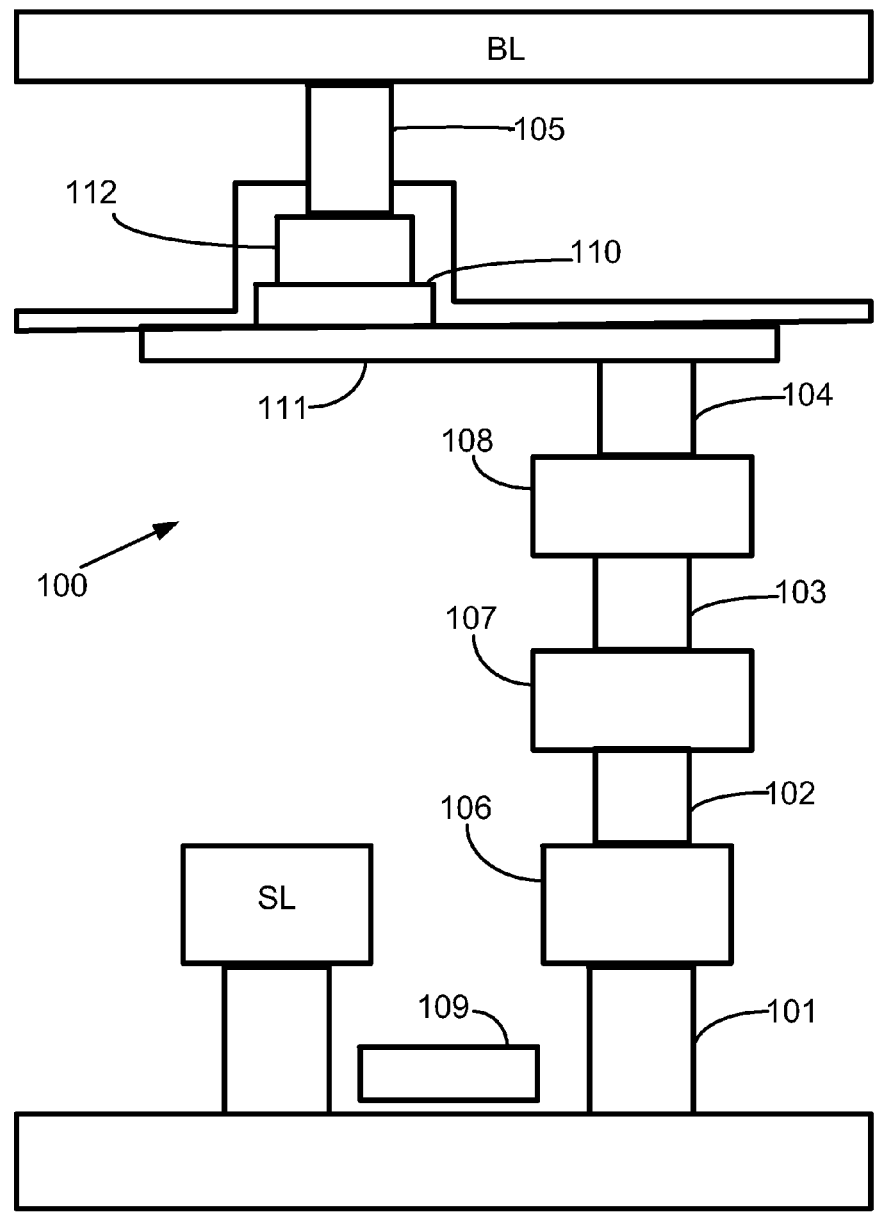
FIG. 10 is a schematic diagram of a multi-bit memory cell utilizing a magnetic element.

A multi-resistance (i.e., at least four resistance) free layer (e.g., free layer 20, free layer 80, free layer 90) would be incorporated into a magnetic element (e.g., a magnetic tunnel junction cell or a magnetic spin valve) such as magnetic element 10 of FIGS. 1A and 1B, having a corresponding pinned layer and non-magnetic layer between the free layer and the pinned layer. The magnetic element could then be incorporated into a magnetic memory unit. FIG. 10 shows a multi-bit magnetic element integrated with a transistor in a typical spin torque memory (i.e., ST RAM).

Memory 100 of FIG. 10 includes a magnetic element 110 (e.g., magnetic element 10 having free layer 20, free layer 80 or free layer 90). Magnetic element 110 is electrically connected to a bit line BL and a source line SL through a series of connections. Proximate element 110 is a first electrode 111 that is electrically connected to source line SL by a first via 101, a second via 102, a third via 103 and a fourth via 104. Positioned between the vias are conductive interconnects 106, 107, 108, which together with vias 101, 102, 103, 104 provide electrical connection from magnetic element 110, through gate 109 to source line SL. Proximate element 110, opposite first electrode 111, is a second electrode 112 that is electrically connected to bit line BL by fifth via 105.

A controller, not illustrated, applies current through magnetic element 110 to switch the magnetization orientation of the free layer and thus switch the resistance state. Depending on the amplitude of the current, the magnetization orientation and thus resistance state will be one of at least four resistance states (i.e., one of four resistance states of free layer 20, 80 or one of eight resistance states of free layer 90, etc.). To read or determine the resistance state (i.e., the bit) within magnetic element 110, a lesser current is passed through magnetic element (typically few tens of microAmps).

Magnetic elements as described herein can also be switched from one resistance state to another using a variable or tunable voltage source. In embodiments, the variable or tunable voltage source can be a voltage source that can be configured to provide current having different voltages to the magnetic element. In embodiments, the variable or tunable voltage source can be one that can reproducibly provide currents having slight differences in voltages (i.e., the voltage source is one that is tightly tunable). Magnetic elements can also be utilized in systems where the magnetic element is electrically connected to a tunable voltage source.

In embodiments where the magnetic element has four, eight, or more magnetic states, a high voltage, short pulse can be utilized to jump from one state to a neighboring state. In embodiments, a magnetic element could be initialized and then 1, 2, 3, or more short, high voltage pulses could be applied to get each of the magnetic states within the magnetic element to its desired state.

The free layers, magnetic elements, and spin torque memory structures of this disclosure may be made by well-known thin film building and removal techniques such as chemical vapor deposition (CVD), physical vapor deposition (PVD), atomic layer deposition (ALD), photolithography, dry etching, wet etching, or ion milling. The physical shape of the free layer will affect the method for producing the shape. For example, a free layer having four arms (for example, such as free layer 20) may be easiest to make by deposition. Whereas, for example, a free layer having numerous arms (for example, such as free layer 90 having eight arms 92) may be easier made by ion milling than by deposition, but could be made by deposition.

Thus, embodiments of the MULTI-BIT STRAM MEMORY CELLS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A system comprising:
   a multi-bit spin torque magnetic element comprising:
      a ferromagnetic pinned layer having a pinned magnetization orientation;
      a ferromagnetic free layer having a magnetization orientation switchable among at least four directions, the at least four directions defined by a physical shape of the free layer; and
      a non-magnetic layer between the pinned layer and the free layer, the magnetic element having at least four distinct resistance states; and
   a tunable voltage source,
   wherein the tunable voltage source is electrically connected to the multi-bit spin torque magnetic element.

2. The system of claim 1, wherein the at least four directions are 90 degrees apart.

3. The system of claim 1, wherein the at least four directions are not 90 degrees apart.

4. The system of claim 1 wherein the free layer has a magnetization orientation switchable among at least eight directions, the eight directions defined by the physical shape of the free layer, and the magnetic element having at least eight distinct resistance states.

5. A system comprising:
   a multi-bit spin torque magnetic element comprising:
      a ferromagnetic pinned layer having a pinned magnetization orientation;
      a ferromagnetic free layer having a magnetization orientation switchable among at least four directions, the free layer having a physical shape with at least four arms, with one of the four directions extending between adjacent arms; and a non-magnetic layer between the pinned layer and the free layer; and a tunable voltage source, wherein the tunable voltage source is electrically connected to the multi-bit spin torque magnetic element.

6. The system of claim 5, wherein each of the at least four arms has a length and a width, and wherein each of the at least four arms has the same length as width.

7. The system of claim 5, wherein each of the at least four arms has a length and a width, and wherein each of the at least four arms has the same length and width.

8. The system of claim 5, wherein each of the at least four arms has a length and a width that are the same, and wherein each of the at least four arms has the same length and width.

9. The system of claim 5, wherein each of the at least four arms has a length and a width, and wherein the width of each of the at least four arms changes along the length of the arm.

10. The system of claim 5, wherein the at least four directions are 90 degrees apart.

11. The system of claim 5, wherein the at least four directions are not 90 degrees apart.

12. The system of claim 5 wherein the free layer has a magnetization orientation switchable among at least eight directions, the free layer has a physical shape with at least eight arms, with one of the eight directions extending between adjacent arms.

13. The system of claim 12, wherein each of the at least eight arms has a length and a width, and wherein the width of each of the at least eight arms changes along the length of the arm.

14. The system of claim 5, wherein the pinned layer magnetization orientation is between two adjacent of the at least four directions.

15. The system of claim 5, wherein the multi-bit spin torque magnetic element is electrically connected to a transistor.

16. A method of affecting a resistance state of a magnetic element, the method comprising:
   providing a magnetic element that comprises
      a ferromagnetic pinned layer having a pinned magnetization orientation;
      a ferromagnetic free layer having a magnetization orientation switchable among at least four directions, the at least four directions defined by a physical shape of the free layer; and
      a non-magnetic layer between the pinned layer and the free layer,
      wherein the magnetic element is a spin-torque magnetic element and has at least four distinct resistance states; and
   driving a first current through the magnetic element in order to switch the resistance state of the magnetic element, wherein the current is from a tunable voltage source.

17. The method of claim 16 further comprising determining the resistance state of the magnetic element by passing a current through the magnetic element.

18. The method of claim 17, wherein the current for determining the resistance state is less than the current to switch the resistance state.

19. The method of claim 18, wherein the current for determining the resistance is tens of microAmps.

20. The method of claim 17 further comprising driving a second current through the magnetic element in order to switch the resistance state of the magnetic element, wherein the second current has a different voltage than the first current.

21. The method of claim 16 further comprising applying two or more short, high voltage pulses to the magnetic element.

* * * * *